(12) United States Patent
Okuyama

(10) Patent No.: US 10,185,020 B1
(45) Date of Patent: Jan. 22, 2019

(54) METHOD OF COMPENSATING LOSS AND DISPERSION OF TRANSMISSION LINE FOR TIME DOMAIN REFLECTOMETRY

(71) Applicant: Keysight Technologies, Inc., Minneapolis, MN (US)

(72) Inventor: Sho Okuyama, Kobe (JP)

(73) Assignee: Keysight Technologies, Inc., Santa Rosa, CA (US)

(*) Notice: Subject to any disclaimer, the term of this patent is extended or adjusted under 35 U.S.C. 154(b) by 138 days.

(21) Appl. No.: 14/977,704

(22) Filed: Dec. 22, 2015

(51) Int. Cl.
*G01R 35/00* (2006.01)
*G01R 31/11* (2006.01)

(52) U.S. Cl.
CPC .............. *G01R 35/00* (2013.01); *G01R 31/11* (2013.01)

(58) Field of Classification Search
USPC .................................................. 324/532–535
See application file for complete search history.

(56) References Cited

U.S. PATENT DOCUMENTS

| | | | |
|---|---|---|---|
| 5,055,795 A * | 10/1991 | Kasper | H04L 25/03038 330/149 |
| 6,437,578 B1 | 8/2002 | Gumm | |
| 7,295,018 B2 | 11/2007 | Oakley | |
| 2005/0238037 A1* | 10/2005 | Dodds | H04L 43/50 370/420 |
| 2013/0158922 A1* | 6/2013 | Fertner | H04B 3/46 702/70 |
| 2014/0021963 A1* | 1/2014 | Cole | G01R 31/11 324/537 |
| 2015/0338450 A1* | 11/2015 | El Sahmarany | G01R 31/11 702/58 |
| 2016/0094292 A1* | 3/2016 | Mochizuki | H04B 10/6165 398/208 |
| 2016/0191020 A1* | 6/2016 | Velazquez | H03H 21/0067 341/118 |

OTHER PUBLICATIONS

A Complete 64Gb/s/lane Active Electrical Repeater. Jan. 23, 2014/.*

* cited by examiner

*Primary Examiner* — Vincent Q Nguyen (57) ABSTRACT

A system and method compensates distortions in transmission line measurement by obtaining a frequency response of a transmission line responsive to a test signal; approximating the frequency response as a function of a complex valued variable; and applying an analytic continuation to extend the function of the complex valued variable to a modified frequency response corresponding to a lossless frequency response, to compensate for loss in the transmission line. The modified frequency response may be further sampled at linearly spaced points in a wave number domain to compensate for dispersion of the transmission line.

12 Claims, 5 Drawing Sheets

METHOD OF COMPENSATING LOSS AND DISPERSION OF TRANSMISSION LINE FOR TIME DOMAIN REFLECTOMETRY

BACKGROUND

Time domain reflectometry (TDR) and time domain transmissiometry (TDT) are commonly used techniques to characterize transmission lines. TDR is used to locate discontinuities in the transmission lines. The discontinuities cause reflections and appear as peaks on the TDR waveform. The shape of the each peak represents characteristics of the discontinuity. For example, a frequency response of a standalone discontinuity can be extracted from the TDR waveform by a technique called gating, which masks the TDR waveform, leaving the peaks as is and filling other portions of the TDR waveform with zeros. The masked TDR waveform is transformed into the frequency domain by Fourier transform to reproduce the frequency response of the standalone discontinuity. TDT is used to measure an electrical delay of the transmission line. The distance from a reference plane to a first peak in the TDT waveform corresponds to the electrical delay of the transmission line.

If there was no loss (attenuation) and/or dispersion in the transmission line, the peaks would be sharp. However, real transmission lines have loss and dispersion that flatten the peaks, and make it difficult to determine the locations and the magnitudes of the peaks in the TDR/TDT waveforms. Gating does not work effectively if the peaks of the TDR waveform are flattened.

There have been attempts to prevent the occurrence of flattened peaks in TDR/TDT waveforms due to transmission line loss and/or dispersion. Typical approaches have not been very successful, especially with respect to loss compensation, and generally result in unrealistic TDR/TDT waveforms. For instance, typical approaches often assume that the reflection coefficient of each discontinuity is constant with respect to frequency. However, lumped elements such as capacitors and inductors have frequency dependent characteristics and produce peaks accompanied by long tails in the TDR waveform. The assumption of a constant reflection coefficient is not valid for these lumped elements. Other typical approaches have overcompensation problems, which cause the TDR/TDT waveform to diverge (increase or decrease) as the distance from the reference plane increases, even if no discontinuity or variation in impedance of the transmission line occurs.

SUMMARY

Embodiments of the inventive concept provide a method and apparatus that compensates for loss and dispersion of transmission lines, while maintaining frequency characteristics of discontinuities and avoiding divergence, to provide more realistic TDR/TDT waveforms.

Embodiments of the inventive concept provide a method of compensating distortions in transmission line measurement, the method including obtaining a frequency response of a transmission line responsive to a test signal; approximating the frequency response as a function of a complex valued variable; and applying an analytic continuation to extend the function of the complex valued variable to a modified frequency response corresponding to a lossless frequency response, to compensate for loss in the transmission line.

Embodiments of the inventive concept provide a method of compensating dispersion in transmission line measurement, the method including obtaining a frequency response of a transmission line responsive to a test signal, the frequency response being expressed as a function of frequency; changing the frequency response to be expressed as a function of a wave number instead of as the function of frequency; and applying interpolation to the function of the wave number to obtain values at linearly spaced points in a wave number domain.

Embodiments of the inventive concept provide a measurement apparatus including a transmitter configured to launch a test signal into a transmission line; a receiver configured to receive a signal from the transmission line responsive to the test signal; and a controller configured to obtain a frequency response of the transmission line responsive to the received signal, approximate the frequency response as a function of a complex valued variable, and apply an analytic continuation to extend the function of the complex valued variable to a modified frequency response corresponding to a lossless frequency response, to compensate for loss in the transmission line.

BRIEF DESCRIPTION OF THE DRAWINGS

The illustrative embodiments are best understood from the following detailed description when read with the accompanying drawing figures. Wherever applicable and practical, like reference numerals refer to like elements.

DETAILED DESCRIPTION

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the inventive concept to one of ordinary skill in the art. Accordingly, known processes, elements, and techniques are not described with respect to some of the embodiments. In the drawings, the size and relative sizes of layers and regions may be exaggerated for clarity. Unless otherwise noted, like reference numerals denote like elements throughout the attached drawings and written description, and thus descriptions may not be repeated.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It should be further understood that the terms "comprises" and/or "comprising," or "includes" and/or "including" when used in this specification, specify the presence of stated features, regions, integers, steps, operations, elements, components and/or groups, but do not preclude the presence or addition of one or more other features, regions, integers, steps, operations, elements, components, and/or groups thereof. The term "exemplary" is intended to refer to an example or illustration.

Unless otherwise defined, all terms (including technical and scientific terms) used herein have the same meaning as commonly understood by one of ordinary skill in the art to which this inventive concept belongs. It should be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used in the specification and appended claims, and in addition to their ordinary meanings, the terms "substantial" or "substantially" mean to within acceptable limits or degree. For example, "substantially canceled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Figure 1:
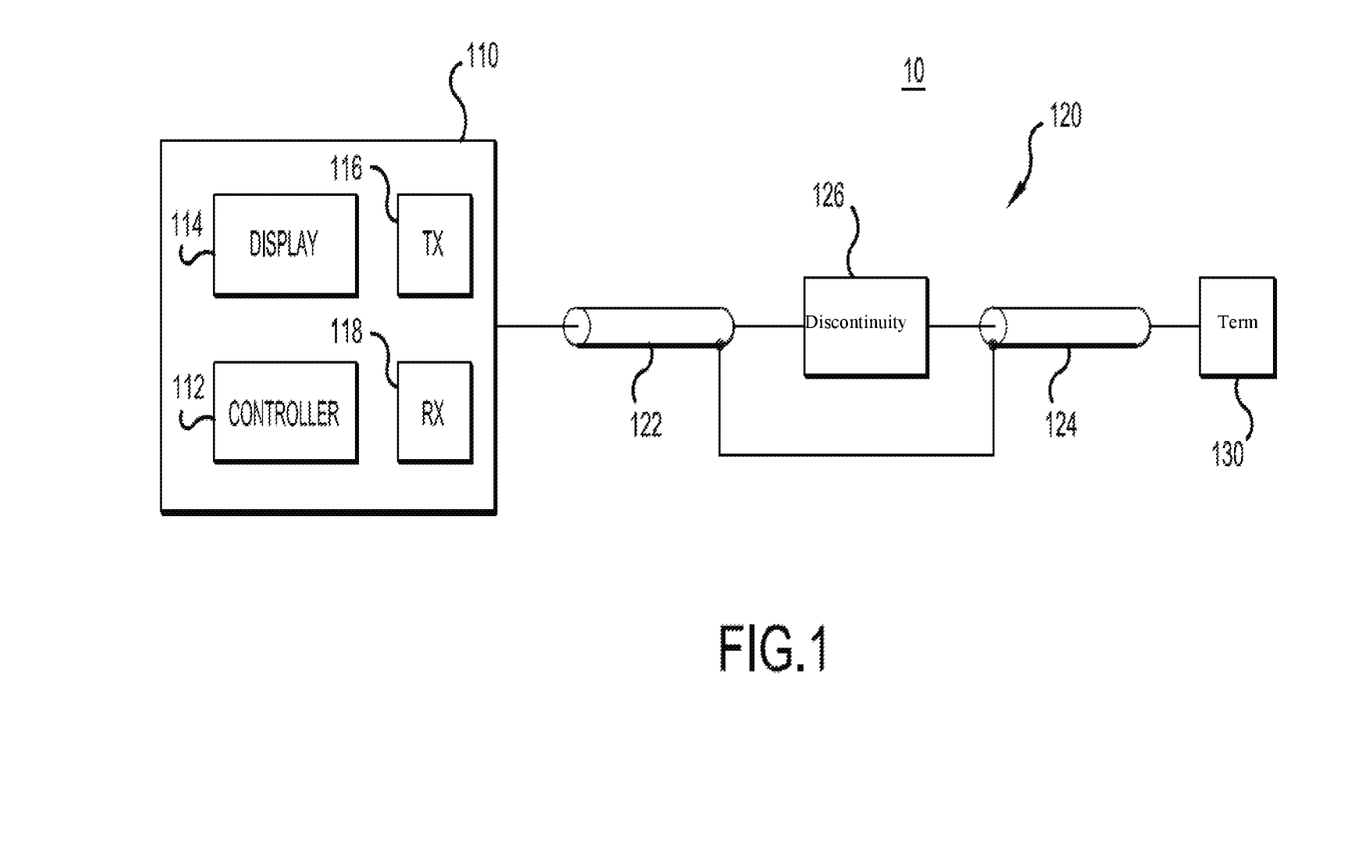
FIG. 1 illustrates a block diagram of a system that compensates distortions in transmission line measurements, according to an embodiment of the inventive concept.

FIG. 1 illustrates a block diagram of system 10 that compensates distortions in transmission line measurements, according to an embodiment of the inventive concept. System 10 as shown in FIG. 1 includes measurement apparatus 110, transmission line 120 and termination 130 for TDR measurement.

Transmission line 120 as shown in FIG. 1 consists of one or more lossy/dispersive line elements such as 122 and 124, with discontinuity 126 there between. The discontinuity 126 may cause reflections and produce peaks on a time domain reflectometry (TDR) waveform responsive to a test signal launched into transmission line 120. In embodiments of the inventive concept subsequently described, the loss characteristics and dispersion relation of the lossy/dispersive line elements 122 and 124 must be pre-known, and almost uniform along the entirety of transmission line 120, but may vary with frequency. The loss characteristics and dispersion relation may be obtained or derived by actual measurement, electromagnetic simulation or appropriate empirical models. Transmission line 120 may be a coaxial cable, a stripline, a microstrip, a waveguide, a printed circuit board (PCB), or the like. Termination 130 is connected to a remote end of transmission line 120 for TDR measurement. An impedance of the termination 130 may be close to a characteristic impedance of the transmission line 120, so as not to produce unnecessary reflections.

Measurement apparatus 110 as shown in FIG. 1 includes controller 112, display 114, transmitter (Tx) 116 and receiver (Rx) 118. In other embodiments, measurement apparatus 110 may be a network analyzer.

Controller 112 of measurement apparatus 110 as shown in FIG. 1 may be interconnected to display 114, transmitter 116 and receiver 118 via internal wiring/interconnections (not shown). Controller 112 may be constructed of any combination of hardware (electronic), firmware or software architectures. Controller 112 may be implemented by an application specific integrated circuit (ASIC) or part of an ASIC, or by a field programmable gate array (FPGA) or part of an FPGA. Controller 112 may include its own memory (e.g., nonvolatile memory) for storing executable software/firmware code that allows it to perform various control and process operations. Alternatively, the executable code may be stored in designated memory locations within a separate memory (not shown). The memory may be any number, type and combination of external and internal nonvolatile read only memory (ROM) and volatile random access memory (RAM), and may store various types of information, such as signals and/or computer programs and software algorithms executable by controller 112. The memory may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, or the like.

Transmitter 116 is configured to transmit or launch a test signal along transmission line 120, under control of controller 112. The test signal may be a single tone sinusoidal wave, multi-tone sinusoidal wave, an impulse, a step pulse or a modulated signal. Receiver 118 is configured to receive a signal from transmission line 120 responsive to the test signal. In embodiments of the inventive concept, the received signal may be a signal (first signal) consisting of the test signal reflected from a discontinuity within transmission line 120. In other embodiments of the inventive concept, instead of receiver 118 being disposed in measurement apparatus 110, for TDT measurement for example termination 130 may be replaced by a receiver such as receiver 118 that may be connected to a controller such as controller 112. In such other embodiments, the received signal may be a signal (second signal) consisting of the test signal that reaches the receiver at the remote end of transmission line 120. Transmitter 116 and receiver 118 may be synchronized to determine a reference plane or time origin of the received signal. If a network analyzer is employed, a calibration plane may be the reference plane. Receiver 118 may be further configured to provide the received signal to controller 112. In embodiments of the inventive concept, controller 112 may be configured to obtain a frequency response of the transmission line 120 by measuring amplitude and phase of the reflected signal or transmitted signal provided from transmission line 120. In other embodiments of the inventive concept, controller 112 may be configured to obtain a frequency response of the transmission line 120 by transforming a time domain impulse response provided from transmission line 120 responsive to the test signal by Fourier transform.

Display 114 is configured to display TDR waveforms of the received signal from transmission line 120 responsive to the test signal, under control of controller 112, as will be subsequently described.

According to embodiments of the inventive concept, an analytic continuation is applied by controller 112 of measurement apparatus 110 to a frequency response of transmission line 120, to obtain a modified frequency response with loss and dispersion compensated. The frequency response is approximated by controller 112 as a function of a complex valued variable (loss factor+j*wave number), instead of as a function of a real valued frequency. The function of the complex valued variable is extended by controller 112 to an entire complex plane by the analytic continuation, so that values of the complex valued function on the imaginary axis are obtained. The values on the imaginary axis, or in other words the modified frequency response, correspond to a lossless frequency response, as the real part or the loss factor is zero. The analytic continuation may be by Laurent series. According to further embodiments of the inventive concept, the modified frequency response may also be sampled by controller 112 at linearly spaced points in a wave number domain or along the imaginary axis on the complex plane, to compensate for dispersion of transmission line 120. By applying an inverse Fourier transform to the modified frequency response, controller 112 provides a time domain waveform with loss and dispersion compensated. The time domain waveform may be displayed on display 114 under control of controller 112. Embodiments of the inventive concept will be described in further detail with reference to the flowchart as shown in FIG. 2 as follows.

Figure 2:
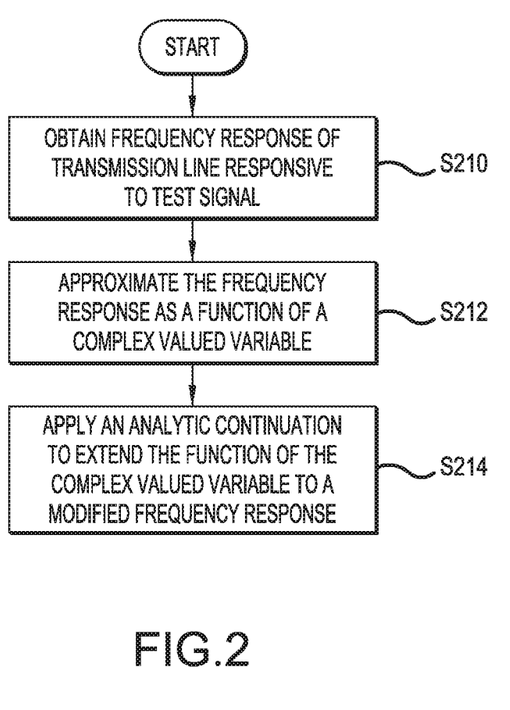
FIG. 2 illustrates a flow chart descriptive of a method of compensating distortions in transmission line measurement, according to an embodiment of the inventive concept.

FIG. 2 illustrates a flow chart descriptive of a method of compensating distortions in transmission line measurement, according to an embodiment of the inventive concept. The following description will be provided with reference to FIGS. 1 and 2.

In step S210 of FIG. 2, the frequency response of transmission line 120 is obtained responsive to a test signal. As previously described, transmitter 116 of measurement apparatus 110 is configured to transmit the test signal to transmission line 120 under control of controller 112. Receiver 118 is configured to subsequently provide a received signal (the aforementioned first signal) to controller 112. Controller 112 is configured to measure amplitude and phase of the received signal provided from transmission line 120, or to obtain a frequency response of the transmission line 120 by transforming a time domain impulse response of the received signal provided from transmission line 120 responsive to the test signal by Fourier transform. In embodiments in which the receiver is disposed at the remote end of transmission line 120, a controller connected to the receiver may be configured to measure amplitude and phase of the received signal (the aforementioned second signal) provided from transmission line 120, or to obtain a frequency response of the transmission line 120 by transforming a time domain impulse response of the received signal provided from transmission line 120 by Fourier transform.

With a loss factor, $\alpha(f)$, and a wavenumber, $\beta(f)$, which are functions of frequency, the frequency response of the transmission line is modeled by controller 112 as:

$$S(f) = \Sigma_l \rho_l(f) e^{-(\alpha+j\beta)d_l} \quad (1)$$

where $\rho_l(f)$ and $d_l$ are frequency characteristics of the reflections associated with the discontinuity (such as 126) and their distance from the reference plane, respectively. Multi-reflections involving several discontinuities may be counted by controller 112 and added as independent reflections. It is noted that in particular, that $\alpha(f)=0$ if the transmission line has no loss, and $\beta(f)$ will be proportional to frequency f if the transmission line has no dispersion.

In step S212 of FIG. 2, assuming that $\alpha(f) \ll \beta(f)$, which is usually the case, the frequency response S(f) is approximated by controller 112 as a function of a complex valued variable $\gamma \equiv \alpha + j\beta$ as:

$$S(f) \approx \Sigma_l \rho_l(\beta^{-1}(-j\gamma))e^{-\gamma d_l} \equiv S'(\gamma) \quad (2)$$

Of note, $\gamma$ is the propagation constant of transmission line 120. For equation (2), the analogy to Laplace transform is noted.

If it is thereafter assumed that a modified frequency response defined as $$S'(jk_m) = \Sigma_n \beta_n(\beta^{-1}(k_m))e^{-jk_m d_l} \quad (3)$$

may be obtained, the discrete inverse Fourier transform defined below gives a time domain waveform with loss and dispersion compensated:

$$T(x) = \sum_{m=0}^{M-1} S'(jk_m)e^{jk_m x}, \quad (4)$$

where $k_m$ is a series of linearly spaced real values, m is the index of the series, and M is the size of the series.

In step S214 of FIG. 2, an analytic continuation is applied by controller 112 to equation (2), to extend the function of the complex valued variable to the modified frequency response $S'(jk_m)$.

Figure 3:
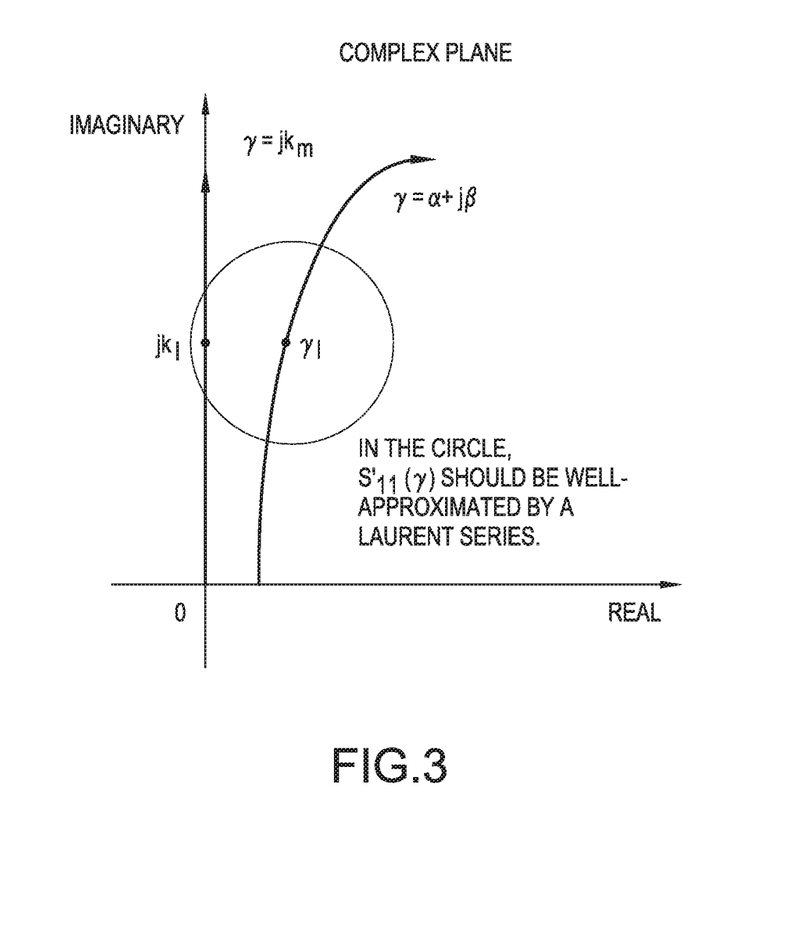
FIG. 3 illustrates a visualization of the concept of analytic continuation, according to an embodiment of the inventive concept.

FIG. 3 illustrates a visualization of the concept of analytic continuation, according to an embodiment of the inventive concept. $S'(\gamma)$ is assumed to be analytic. Controller 112 expands $S'(\gamma)$ by Laurent series around an arbitrary point, z, on a trace defined by $\alpha(f)+j\beta(f)$ to:

$$S'(\gamma) = \sum_{n=-\infty}^{\infty} a_n(\gamma - z)^n. \quad (5)$$

The coefficients $a_n$ should be zero for n<0 because the Laplace transform of a passive device has no pole on the right-half of the complex plane. Expanding equation (5) further and neglecting higher order terms greater than N gives:

$$S'(\gamma) \approx \sum_{n=0}^{N} b_n \gamma^n. \quad (6)$$

The coefficients $b_n$ are determined by controller 112 by fitting equation (6) to the measured frequency response S(f) of equation (1) at corresponding fitting points: $\alpha(f)+j\beta(f)$. The number of the fitting points must be larger than N for the nature of the fitting. The larger the order of equation (6) and consequently the greater the number of fitting points used, the more accurate result will be achieved. However, as the order of equation (6) and the number of fitting points increase, the computational resources utilized by controller 112 will consequently increase. Accordingly, in embodiments of the inventive concept, the order of equation (6) and the number of the fitting points may be maintained small enough to complete the calculation within an acceptable time. In embodiments of the inventive concept, instead of increasing the order of equation (6) and the number of the fitting points, the coefficients $b_n$ may be recalculated for each $jk_m$ with the fitting points closest to $jk_m$. Finally, substituting $\gamma$ with $jk_m$ provides $S'(jk_m)$.

In embodiments of the inventive concept, controller 112 may transform the modified frequency response as shown in equation (3) by inverse Fourier transform, and may control display 114 to display the transformed modified frequency response.

Figure 4:
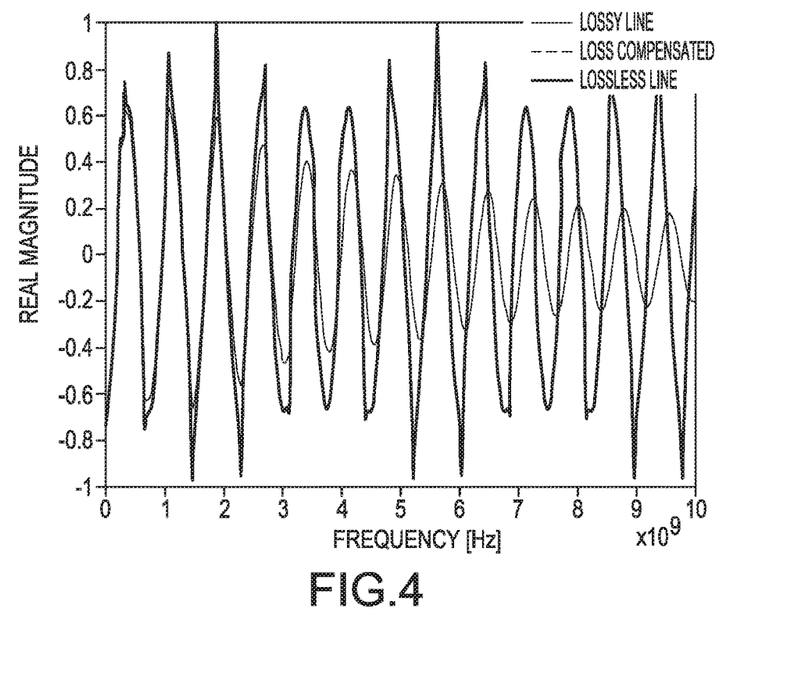
FIG. 4 illustrates a graph including curves showing how the compensated transmission line measurement of embodiments of the inventive concept compares to measurement of an ideal lossless transmission line.

FIG. 4 illustrates a graph including curves showing how the compensated transmission line measurement of embodiments of the inventive concept compares to the measurement of an ideal lossless transmission line. FIG. 4 shows three curves respectively corresponding to a frequency response of a lossy transmission line, a frequency response of a transmission line compensated for loss and dispersion in accordance with the embodiments of the inventive concept, and a frequency response of an ideal lossless transmission line, each responsive to a same test signal. As may be appreciated from FIG. 4, the compensated frequency response as derived in accordance with the embodiments of the inventive concept is in good agreement with the frequency response of the ideal lossless transmission line.

Figure 5:
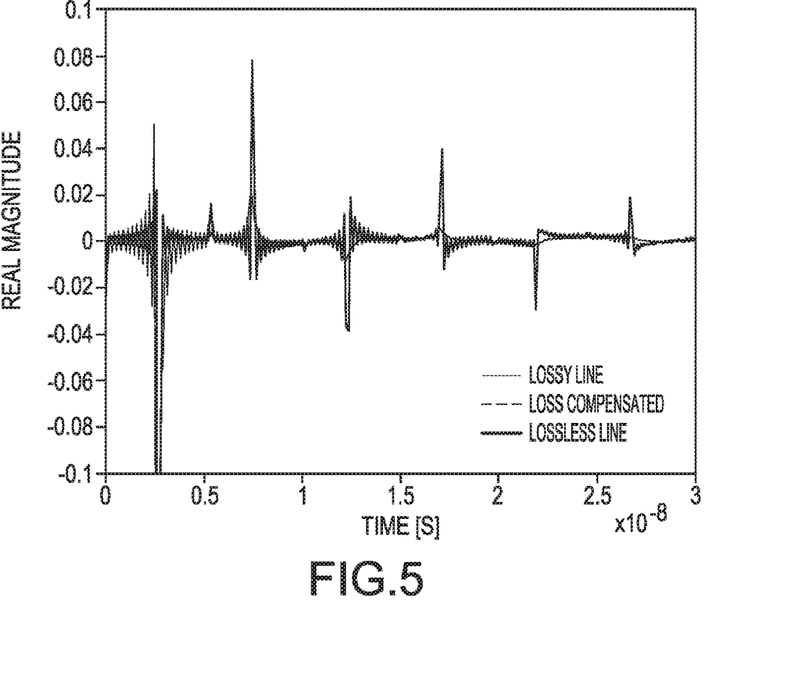
FIG. 5 illustrates a graph including TDR waveforms of the corresponding frequency responses shown in FIG. 4.

FIG. 5 illustrates a graph including TDR waveforms of the corresponding frequency responses shown in FIG. 4. The TDR waveforms are inverse Fourier transforms of the corresponding frequency responses. As may be appreciated from FIG. 5, the TDR waveform corresponding to the compensated frequency response as derived in accordance with the embodiments of the inventive concept is in good agreement with the TDR waveform of the corresponding frequency response of the ideal lossless transmission line.

In accordance with a further embodiment of the inventive concept, dispersion in a transmission line that approximates a lossless transmission line may be compensated for by simpler interpolation instead of by analytic continuation in the complex plane, as will be subsequently described.

Figure 6:
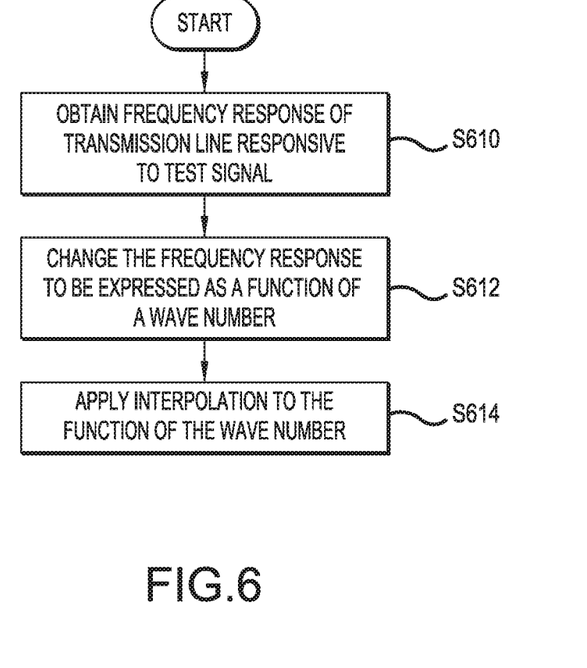
FIG. 6 illustrates a flowchart descriptive of a method of compensating dispersion in transmission line measurement, according to an embodiment of the inventive concept.

FIG. 6 illustrates a flowchart descriptive of a method of compensating dispersion in transmission line measurement, according to an embodiment of the inventive concept. The transmission line in this embodiment approximates a lossless transmission line. The following description will be provided with reference to FIGS. 1 and 6.

In step S610 of FIG. 6, the frequency response of transmission line 120 is obtained responsive to a test signal. As previously described above with respect to FIGS. 1 and 2, transmitter 116 of measurement apparatus 110 is configured to launch the test signal into transmission line 120 under control of controller 112, and receiver 118 is configured to subsequently provide a received signal responsive to the transmission line 120 to controller 112. Controller 112 is configured to measure amplitude and phase of the received signal provided from transmission line 120, or to obtain a frequency response of the transmission line 120 by transforming a time domain impulse response of the received signal provided from transmission line 120 responsive to the test signal by Fourier transform. In this case, the obtained frequency response of transmission line 120 is expressed as a function of frequency. The obtained frequency response S(f) is modeled by controller 112 such as in equation (1), however with $\alpha=0$. In embodiments in which the receiver is disposed at the remote end of transmission line 120, a controller connected to the receiver may be configured to measure amplitude and phase of the received signal (the aforementioned second signal) provided from transmission line 120, or to obtain a frequency response of the transmission line 120 by transforming a time domain impulse response of the received signal provided from transmission line 120 by Fourier transform.

In step S612 of FIG. 6, controller 112 is configured to change the obtained frequency response of transmission line 120 to be expressed as a function of a wave number instead of as the function of frequency. This consists of simple variable replacement rather than approximation as described with respect to step S212 of FIG. 2. For example, the obtained frequency response from step S610 may be expressed as a function of frequency by measurement. With the dispersion relation of the transmission line 120, the obtained frequency response from step S610 may however be changed to be expressed as a function of wave number by simple variable replacement.

In step S614 of FIG. 6, controller 112 is configured to apply interpolation to the function of the wave number obtained in step S612 so that the sampled points are linearly spaced in the wave number domain. The interpolation may be one of linear interpolation, cubic interpolation, spline interpolation, Lagrange interpolation or Newton interpolation, or the like. The interpolated function of the wave number may thus be compensated for dispersion within transmission line 120.

In embodiments of the inventive concept, controller 112 may transform the interpolated function of the wave number by inverse Fourier transform, and may control display 114 to display the transformed function of the wave number.

In other embodiments of the inventive concept, transmitter 116 may be configured to generate tone signals whose wave number is linearly spaced in the wave number domain according to the dispersion relation of the transmission line 120.

While representative embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the representative embodiments described herein. More generally, those skilled in the art will readily appreciate that all parameters and configurations described herein are meant to be exemplary and that the actual parameters and/or configurations will depend upon the specific application or applications for which the teachings is/are used. Those skilled in the art will recognize, or be able to ascertain using no more than routine experimentation, many equivalents to the specific representative embodiments described herein. It is, therefore, to be understood that the foregoing embodiments are presented by way of example only and that, within the scope of the appended claims and equivalents thereto, representative embodiments may be practiced otherwise than as specifically described and claimed. In addition, any combination of two or more such features and/or methods, if such features and/or methods are not mutually inconsistent, is included within the inventive scope of the present disclosure.

Also, as is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

The phrase "and/or," as used herein in the specification and in the claims, should be understood to mean "either or both" of the elements so conjoined. In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A measurement apparatus comprising:
    a transmitter configured to launch a test signal into a transmission line;
    a receiver configured to receive a signal from the transmission line responsive to the test signal; and
    a controller configured to obtain a frequency response of the transmission line responsive to the received signal, approximate the frequency response as a function of a complex valued variable, and apply an analytic continuation to extend the function of the complex valued variable to a modified frequency response corresponding to a lossless frequency response, to compensate for loss in the transmission line, wherein the controller is further configured to sample the modified frequency response at linearly spaced points in a wave number domain to compensate for dispersion of the transmission line.

2. The measurement apparatus of claim 1, wherein applying the analytic continuation comprises expanding the function of the complex valued variable by Laurent series.

3. The measurement apparatus of claim 1, wherein the controller is further configured to transform the modified frequency response by inverse Fourier transform, the measurement apparatus further comprising a display configured to display the transformed modified frequency response.

4. The measurement apparatus of claim 1, wherein the analytic continuation is made by a Laurent Series.

5. A measurement apparatus comprising:
    a transmitter configured to launch a test signal into a transmission line;
    a receiver configured to receive a signal from the transmission line responsive to the test signal; and
    a controller configured to obtain a frequency response of the transmission line responsive to the received signal, approximate the frequency response as a function of a complex valued variable, and apply an analytic continuation to extend the function of the complex valued variable to a modified frequency response corresponding to a lossless frequency response, to compensate for loss in the transmission line, wherein the controller is configured to obtain the frequency response by measuring amplitude and phase of either one of a signal reflected from the transmission line, and a signal reaching a remote end of the transmission line.

6. The measurement apparatus of claim 5, wherein applying the analytic continuation comprises expanding the function of the complex valued variable by Laurent series.

7. The measurement apparatus of claim 5, wherein the controller is further configured to transform the modified frequency response by inverse Fourier transform, the measurement apparatus further comprising a display configured to display the transformed modified frequency response.

8. The measurement apparatus of claim 5, wherein the analytic continuation is made by a Laurent Series.

9. A measurement apparatus comprising:
    a transmitter configured to launch a test signal into a transmission line;
    a receiver configured to receive a signal from the transmission line responsive to the test signal; and
    a controller configured to obtain a frequency response of the transmission line responsive to the received signal, approximate the frequency response as a function of a complex valued variable, and apply an analytic continuation to extend the function of the complex valued variable to a modified frequency response corresponding to a lossless frequency response, to compensate for loss in the transmission line, wherein the received signal is a time domain impulse response provided from the transmission line responsive to the test signal, and the controller is configured to obtain the frequency response by transforming the time domain impulse response into the frequency response by Fourier transform.

10. The measurement apparatus of claim 9, wherein applying the analytic continuation comprises expanding the function of the complex valued variable by Laurent series.

11. The measurement apparatus of claim 9, wherein the controller is further configured to transform the modified frequency response by inverse Fourier transform, the measurement apparatus further comprising a display configured to display the transformed modified frequency response.

12. The measurement apparatus of claim 9, wherein the analytic continuation is made by a Laurent Series.

* * * * *